(12) United States Patent
Waite et al.

(10) Patent No.: US 7,977,180 B2
(45) Date of Patent: Jul. 12, 2011

(54) METHODS FOR FABRICATING STRESSED MOS DEVICES

(75) Inventors: Andrew M. Waite, Hopewell Junction, NY (US); Andy C. Wei, Dresden (DE)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 239 days.

(21) Appl. No.: 12/330,296

(22) Filed: Dec. 8, 2008

(65) Prior Publication Data

US 2010/0144105 A1    Jun. 10, 2010

(51) Int. Cl.
*H01L 21/8238* (2006.01)

(52) U.S. Cl. ........ 438/199; 438/197; 438/216; 438/231; 438/299; 438/300; 257/335; 257/341; 257/369; 257/374; 257/E21.639

(58) Field of Classification Search .......................... None
See application file for complete search history.

(56) References Cited

U.S. PATENT DOCUMENTS

| | | | |
|---|---|---|---|
| 6,828,185 B2* | 12/2004 | Lim et al. | 438/216 |
| 7,423,283 B1* | 9/2008 | Luo et al. | 257/19 |
| 2005/0148147 A1* | 7/2005 | Keating et al. | 438/299 |
| 2006/0202278 A1* | 9/2006 | Shima et al. | 257/369 |
| 2007/0052043 A1* | 3/2007 | Cha et al. | 257/412 |
| 2008/0142838 A1* | 6/2008 | Ohta et al. | 257/190 |

* cited by examiner

*Primary Examiner* — N Drew Richards
*Assistant Examiner* — Kyoung Lee
(74) *Attorney, Agent, or Firm* — Ingrassia Fisher & Lorenz, P.C.

(57) ABSTRACT

Methods for fabricating stressed MOS devices are provided. In one embodiment, the method comprises providing a silicon substrate having a P-well region and depositing a polycrystalline silicon gate electrode layer overlying the P-well region. P-type dopant ions are implanted into the polycrystalline silicon gate electrode layer to form a P-type implanted region and a first polycrystalline silicon gate electrode is formed overlying the P-well region. Recesses are etched into the P-well region using the first polycrystalline silicon gate electrode as an etch mask. The step of etching is performed by exposing the silicon substrate to tetramethylammonium hydroxide. A tensile stress-inducing material is formed within the recesses.

20 Claims, 4 Drawing Sheets

METHODS FOR FABRICATING STRESSED MOS DEVICES

FIELD OF THE INVENTION

The present invention generally relates to methods for fabricating semiconductor devices, and more particularly relates to methods for fabricating stressed MOS devices.

BACKGROUND OF THE INVENTION

The majority of present day integrated circuits (ICs) are implemented by using a plurality of interconnected field effect transistors (FETs), also called metal oxide semiconductor field effect transistors (MOSFETs), or simply MOS transistors. An MOS transistor includes a gate electrode as a control electrode overlying a semiconductor substrate and spaced-apart source and drain regions in the substrate between which a current can flow. A control voltage applied to the gate electrode controls the flow of current through a channel in the substrate underlying the gate electrode between the source and drain regions. An N-channel MOS (NMOS) transistor utilizes source and drain regions with N-type impurity dopants and a P-channel MOS (PMOS) transistor utilizes source and drain regions with P-type impurity dopants. Complementary MOS (CMOS) devices include a plurality of NMOS transistors and a plurality of PMOS transistors.

MOS transistors, in contrast to bipolar transistor, are majority carrier devices. The gain of an MOS transistor, usually defined by the transconductance ($g_m$), is proportional to the mobility of the majority carrier in the transistor channel. The current-carrying capability and, hence, the performance of an MOS transistor is proportional to the mobility of the majority carrier in the channel. The mobility of holes, the majority carrier in a PMOS transistor, can be increased by applying a compressive longitudinal stress to the channel. Alternatively, to increase the mobility of electrons, the majority carriers in an NMOS transistor, a tensile transverse stress can be applied to the channel of the NMOS transistor.

A tensile transverse stress can be applied to the channel of an NMOS transistor by depositing a tensile stress-inducing material overlying the NMOS transistor and the source and drain regions of the NMOS transistor. Recessed source and drain electrodes can be used to further improve the performance of the NMOS transistors. By recessing the source and drain electrodes, the tensile stress-inducing material can be deposited into the recesses thereby imparting a greater tensile stress into the channel region than if the source and drain electrodes are not recessed.

However, typically the formation of the recesses in a semiconductor substrate is performed with the gate electrode of the NMOS transistor exposed. If the gate electrode is formed of polycrystalline silicon, etching of a silicon substrate, such as by hydrogen bromide (HBr), to from the recesses will result in etching of the exposed polycrystalline silicon electrode. Etching of the polycrystalline silicon electrode reduces the thickness of the electrode. While a mask layer can be used to mask the gate electrode of the NMOS transistor during etching of the recesses, the additional steps to deposit, pattern, and then remove the mask increase the cost of the MOS fabrication and decrease throughput.

Accordingly, it is desirable to provide an improved method for fabricating an NMOS device that minimizes etching of an NMOS polycrystalline silicon gate electrode during etching of recesses into the substrate of the NMOS device. In addition, it is desirable to provide an improved method for fabricating a CMOS device that does not substantially increase the cost of the CMOS device fabrication and decrease throughput. Furthermore, other desirable features and characteristics of the present invention will become apparent from the subsequent detailed description of the invention and the appended claims, taken in conjunction with the accompanying drawings and this background of the invention.

BRIEF SUMMARY OF THE INVENTION

A method for fabricating a MOS device is provided in accordance with an exemplary embodiment of the present invention. The method comprises providing a silicon substrate having a P-well region and depositing a polycrystalline silicon gate electrode layer overlying the P-well region of the silicon substrate. P-type dopant ions are implanted into the polycrystalline silicon gate electrode layer to form a P-type implanted region and a first polycrystalline silicon gate electrode is formed overlying the P-well region of the silicon substrate. Recesses are etched into the P-well region of the silicon substrate using the first polycrystalline silicon gate electrode as an etch mask. The step of etching is performed by exposing the silicon substrate to tetramethylammonium hydroxide. A tensile stress-inducing material is formed within the recesses.

A method for fabricating a CMOS device is provided in accordance with another exemplary embodiment of the present invention. The method comprises depositing a polycrystalline silicon gate electrode layer overlying a silicon substrate having a P-well region and N-well region and implanting P-type dopant ions into the polycrystalline silicon gate electrode layer to form a P-type implanted region. The polycrystalline silicon gate electrode layer is etched to form an NMOS gate electrode overlying the P-well region and a PMOS gate electrode overlying the N-well region. Sidewall spacers are formed about the NMOS gate electrode and the PMOS gate electrode. N-type impurity dopants are implanted into the P-well region using the NMOS gate electrode and the sidewall spacers as an implantation mask to from source and drain regions of an NMOS transistor and P-type impurity dopants are implanted into the N-well region using the PMOS gate electrode and the sidewall spacers as an implantation mask to from source and drain regions of a PMOS transistor. Recesses are etched into the P-well region using the NMOS gate electrode and the sidewall spacers as an etch mask. The etching is performed by exposing the P-well region to tetramethylammonium hydroxide. A tensile stress-inducing material is formed in the recesses.

BRIEF DESCRIPTION OF THE DRAWINGS

The present invention will hereinafter be described in conjunction with the following drawing figures, wherein like numerals denote like elements, and wherein.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the invention.

FIGS. 1-10 illustrate methods of fabricating a stressed MOS device 10, in accordance with various embodiments of the present invention. In this illustrative embodiment, stressed MOS device 10 is a CMOS device comprising a single NMOS transistor and a single PMOS transistor. As will become clear from the following description, the various embodiments of the invention are particularly directed to the enhancement of the mobility of electrons in the channel of an NMOS transistor. In accordance with one embodiment of the invention, however, an NMOS transistor having enhanced mobility is fabricated together with a PMOS transistor that also has enhanced mobility to achieve a CMOS device having superior characteristics. Those of skill in the art will recognize that the invention can be applied to either single channel NMOS devices or to CMOS devices. An integrated circuit formed from stressed MOS devices fabricated in accordance with embodiments of the invention can include a large number of devices, and may also include both stressed and unstressed PMOS transistors and stressed and unstressed NMOS transistors.

Various steps in the manufacture of MOS transistors are well known and so, in the interest of brevity, many conventional steps will only be mentioned briefly herein or will be omitted entirely without providing the well known process details. Although the term "MOS device" properly refers to a device having a metal gate electrode and an oxide gate insulator, that term will be used throughout to refer to any semiconductor device that includes a conductive gate electrode, in particular a polycrystalline silicon gate electrode, that is positioned over a gate insulator (whether oxide or other insulator) which, in turn, is positioned over a semiconductor substrate.

Figure 1:
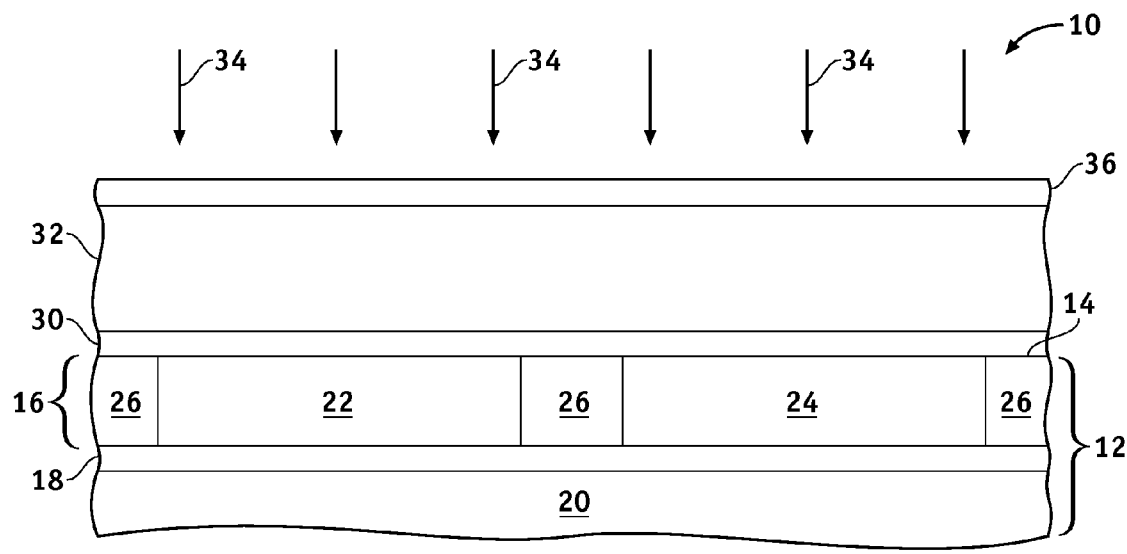
FIGS. 1-10 schematically illustrate, in cross-section, a method for fabricating a CMOS device with recessed source and drain regions in accordance with an exemplary embodiment of the present invention.

As illustrated in cross section in FIG. 1, the fabrication of stressed MOS device 10, in accordance with an embodiment of the invention, begins with providing a semiconductor substrate 12 having a surface 14. The semiconductor substrate can be any monocrystalline semiconductor material, but is preferably a monocrystalline silicon substrate wherein the term "silicon substrate" is used herein to encompass the relatively pure silicon materials typically used in the semiconductor industry. Semiconductor substrate 12 will herein be referred to, for ease of discussion but without limitation, as a silicon substrate. Silicon substrate 12 may be a bulk silicon wafer or, preferably, as illustrated, a thin layer of silicon 16 on an insulating layer 18 (commonly know as silicon-on-insulator or SOI) that, in turn, is supported by a silicon carrier wafer 20. To fabricate a CMOS device, portions of thin silicon layer 16 will be doped with P-type impurity dopants to form P-wells 22 for the fabrication of NMOS transistors and other portions will be doped with N-type impurity dopants to form N-wells 24 for the fabrication of PMOS transistors. The P-wells and N-wells can be doped to the appropriate conductivity, for example, by ion implantation. Shallow trench isolation (STI) 26 or other form of electrical isolation is formed in the silicon substrate and preferably extends through thin silicon layer 16 to insulating layer 18 to electrically isolate individual devices as required by the circuit function being implemented. As is well known, there are many processes that can be used to form the STI, so the process need not be described here in detail. In general, STI includes a shallow trench that is etched into the surface of the silicon substrate and that is subsequently filled with an insulating material. After the trench is filled with the insulating material the surface is usually planarized, for example, by chemical mechanical planarization (CMP).

With reference again to FIG. 1, a gate insulator material layer 30 is formed on the surface 14 of thin silicon layer 16. The gate insulator material layer may be a thermally grown silicon dioxide formed by heating the silicon substrate in an oxidizing ambient or, as illustrated, may be a deposited insulator such as a silicon oxide, silicon nitride, a high dielectric constant insulator such as HfSiO, or the like. Deposited insulators can be deposited by chemical vapor deposition (CVD), low pressure chemical vapor deposition (LPCVD), or plasma enhanced chemical vapor deposition (PECVD). The gate insulator material layer 16 is typically 1-10 nanometers (nm) in thickness. In accordance with one embodiment of the invention, a layer of gate electrode-forming material such as polycrystalline silicon 32 is deposited overlying the gate insulator material layer 30. The layer of polycrystalline silicon is preferably deposited as undoped polycrystalline silicon and is subsequently impurity doped by ion implantation. The polycrystalline silicon material can be deposited, for example, to a thickness of about 100-120 nm by LPCVD by the hydrogen reduction of silane.

Next, the polycrystalline silicon material layer 32 is implanted with P-type conductivity-determining ions, as indicated by arrows 34, to form a P-type implanted region 36. As described in more detail below, P-type implanted polycrystalline silicon has an etch resistance to tetramethylammonium hydroxide (TMAH) and, accordingly, protects subsequently-formed gate electrodes of the polycrystalline silicon material layer 32 when recesses are etched into P-well 22 by TMAH. In one exemplary embodiment, the P-type implanted region is implanted with P-type conductivity-determining ions to a concentration such that, upon ion implantation to form N-type implanted source and drain extensions and regions of a subsequently-formed NMOS transistor as discussed in more detail below, the P-type implanted region is not counter-doped to the extent that it changes from P-type to N-type. In another exemplary embodiment, the P-type implanted region 36 is formed by ion implantation using a boron difluoride ($BF_2$) source and an energy of about 3 to about 5 kilo-electron volts (keV) with a dosage of about $1 \times 10^{15}$ to about $5 \times 10^{15}$ atoms/cm$^2$. The P-type implanted region 36 has a thickness of no greater than about 10 nm.

Figure 2:
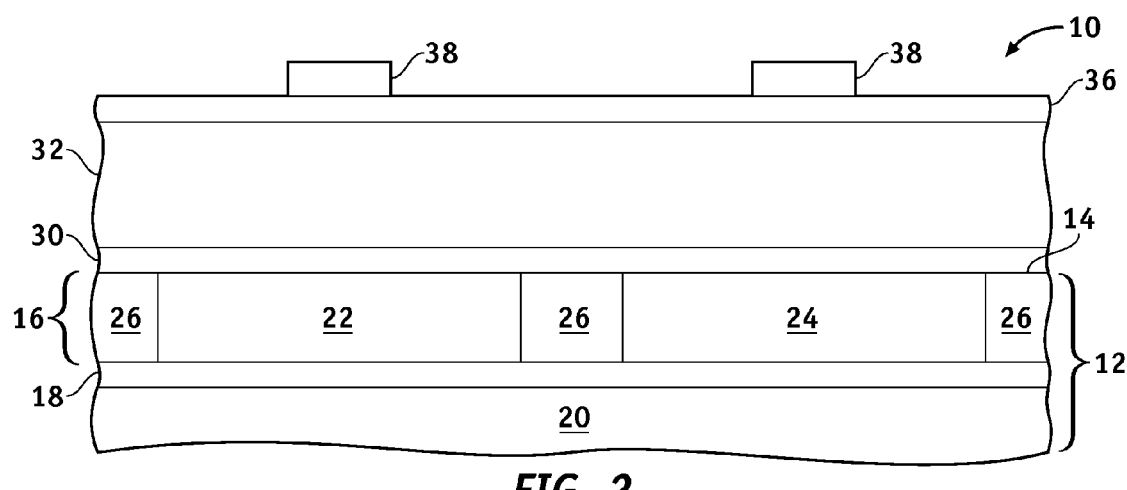
Figure 3:
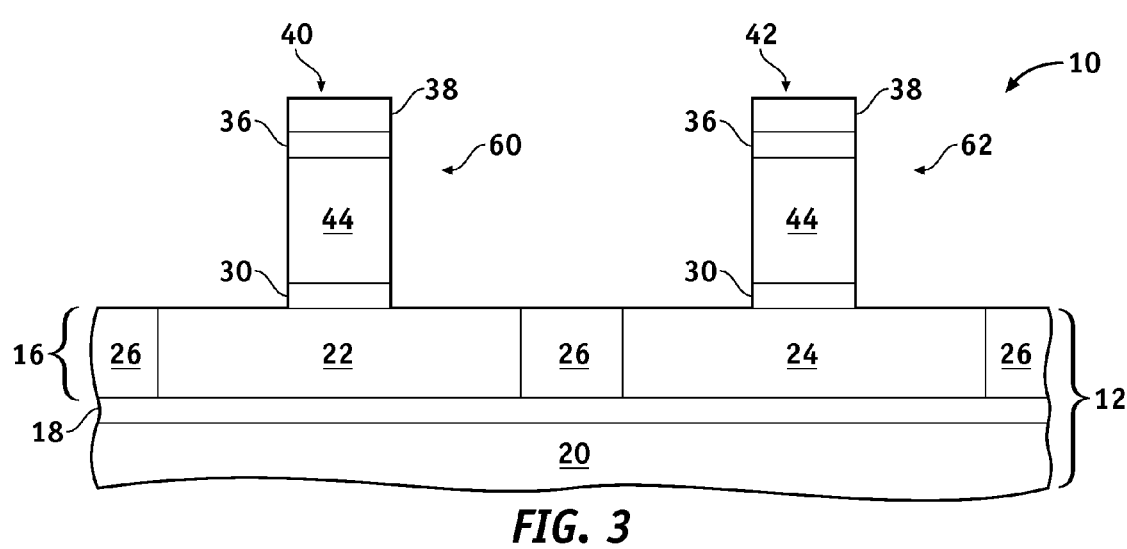

Referring to FIG. 2, a layer of hard mask material (not shown) such as silicon oxide, silicon oxynitride, or, preferably, silicon nitride, is deposited overlying the surface of the polycrystalline silicon material layer 32. The hard mask material layer can be deposited to a thickness of about 50 nm, also by LPCVD. The hard mask material layer then is photolithographically patterned to form hard mask caps 38 overlying the polycrystalline silicon material layer 32. The hard mask caps 38 serve as an etch mask for the etching of the polycrystalline silicon material layer 32 to form MOS transistor gate stacks 40 and 42 comprising gate electrodes 44 overlying surface 14, as illustrated in FIG. 3. Gate stack 40 overlies P-well 22 of thin silicon layer 16 and will form the gate stack of an NMOS transistor 60. In similar manner, gate stack 42 overlies N-well 24 and will form a gate stack of a PMOS transistor 62. The polycrystalline silicon can be etched in the desired pattern by, for example, plasma etching in a Cl$^-$ or HBr/O$_2$ chemistry and the hard mask can be etched, for example, by plasma etching in a CHF$_3$, CF$_4$, or SF$_6$ chemistry. The gate insulator material layer 30 also may be etched during the etching of the polycrystalline silicon layer 32 to form a gate insulator of each gate stack.

Figure 4:
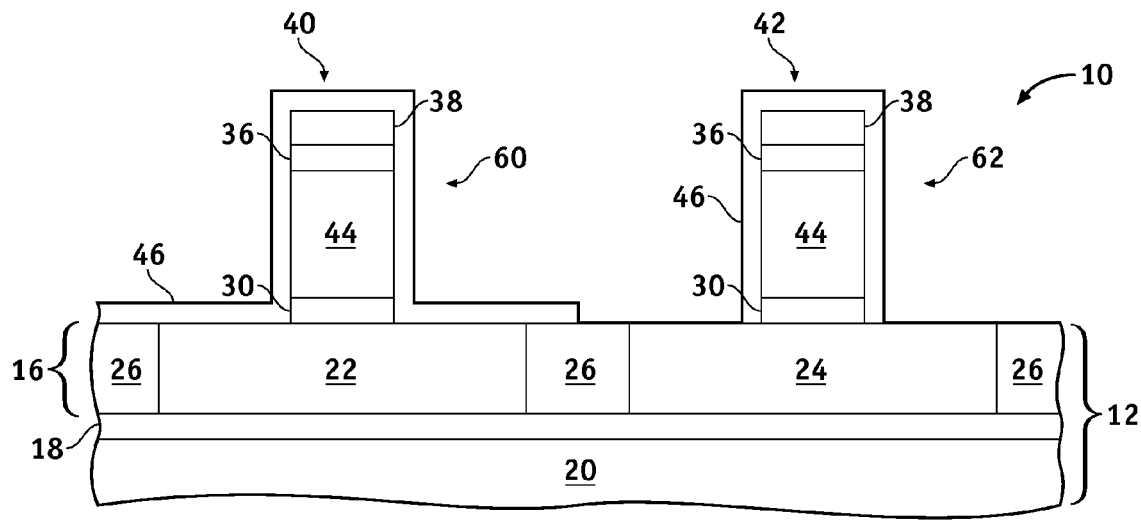
Figure 5:
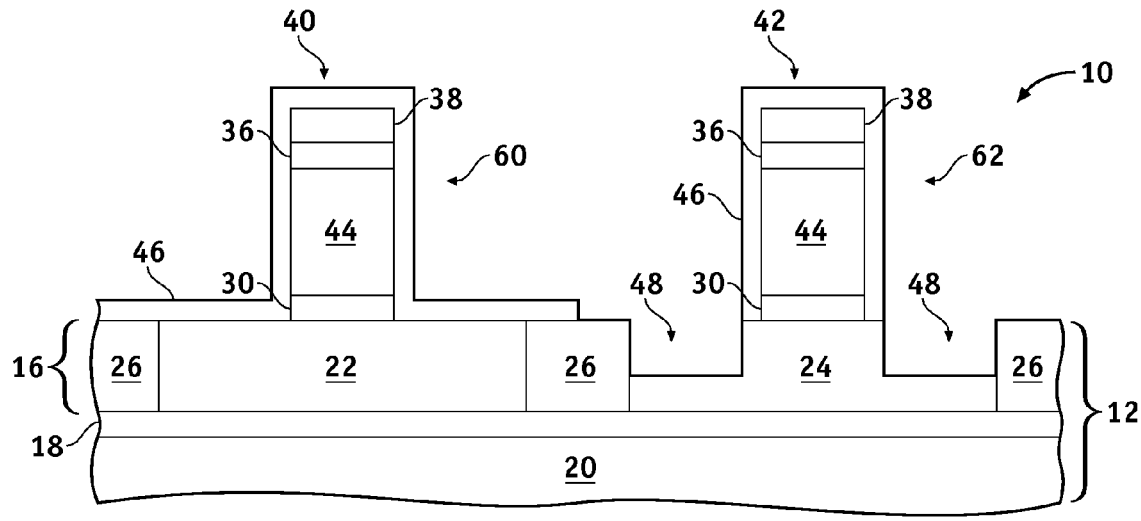

As illustrated in FIG. 4, following the patterning of the gate stacks 40 and 42, in accordance with one embodiment of the invention, a hard mask 46, such as, for example, silicon nitride, is globally deposited overlying gate stacks 40 and 42, P-well 22, and N-well 24 and is photolithographically patterned to mask gate stack 40, P-well region 22, and gate stack 42, and to expose portions of N-well region 24. Referring to FIG. 5, the hard mask 46 and gate stacks 40 and 42 serve as an etch mask during the etching of N-well 24 to form trenches 48 in thin silicon layer 16 which are self-aligned to gate stack 42. The trenches can be anisotropically etched, for example, by reactive ion etching (RIE) using an HBr/$O_2$ and Cl⁻ chemistry. Preferably each of the trenches has a depth of about 0.4-1 nm.

Figure 6:
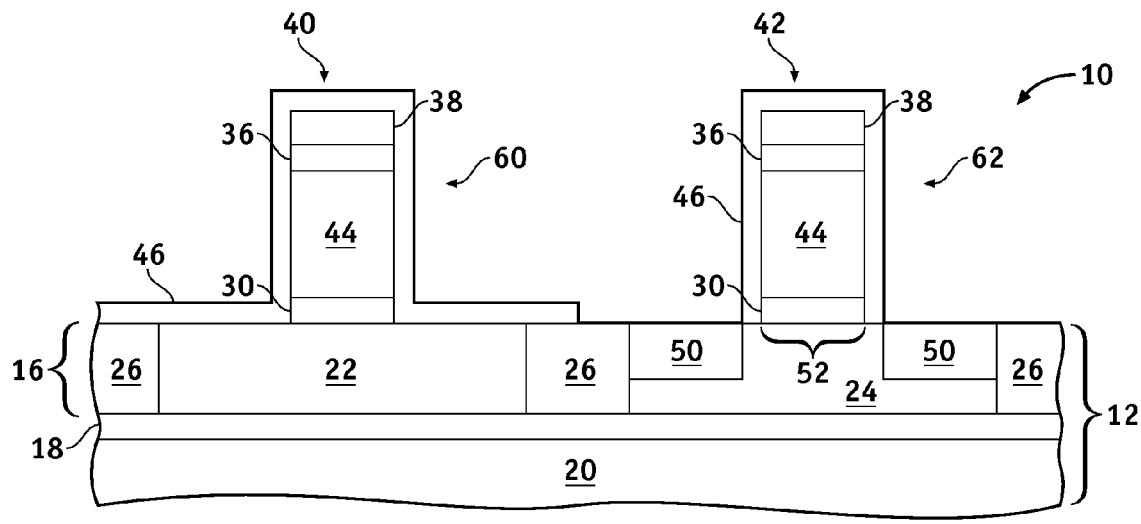

The method continues, as illustrated in FIG. 6, by filling trenches 48 with a layer of stress-inducing material 50, in accordance with an exemplary embodiment. The stress-inducing material can be any monocrystalline material that can be grown on the thin silicon layer 16 with a different lattice constant than the lattice constant of silicon. The difference in lattice constant of the two juxtaposed materials generates a stress at the interface that is then redistributed in the host material. Preferably the stress-inducing material causes the silicon host to deform elastically so that the silicon is stressed, but remains a substantially defect free perfect crystal. Defects can cause a decrease or relief of the stress. The stress-inducing material can be, for example, monocrystalline silicon germanium (SiGe) having about 20-30 atomic percent germanium with the germanium replacing silicon at crystal lattice sites. Preferably the stress-inducing material is epitaxially grown by a selective growth process. Methods for epitaxially growing these materials on a silicon host in a selective manner are well known and need not be described herein. In the case of SiGe, for example, the SiGe has a greater lattice constant than silicon and creates a compressive longitudinal stress within a channel 52 underlying gate stack 42. The compressive longitudinal stress increases the mobility of holes in the channel and hence improves the performance of PMOS transistor 62.

Figure 7:
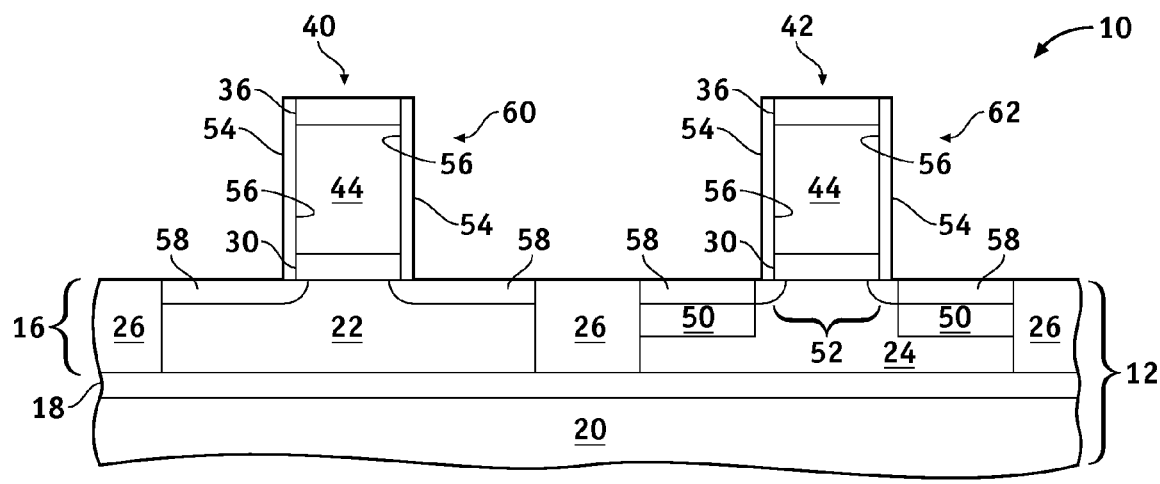

Referring to FIG. 7, the hard mask 46 is removed from the gate stack 40, P-well region 22, and gate stack 42. The hard mask 46 can be removed, for example, by application of hot phosphoric acid. During removal of the silicon nitride hard mask 46, silicon nitride caps 38 also are removed from gate stacks 40 and 42, thus exposing P-type implant regions 36. In an optional embodiment, a thin layer 54 of silicon oxide is thermally grown on opposing sidewalls 56 of gate electrodes 44 of the gate stacks 40 and 42 by heating the polycrystalline silicon in an oxidizing ambient. Layer 54 can be grown to a thickness of about 2-5 nm. Gate stacks 40 and 42 and optional layers 54 then can be used as an ion implantation mask to form source and drain extensions 58 on either or both of the MOS transistors. As is well known, a layer of patterned photoresist can be used to mask the N-well 24 during implantation of the source and drain extensions 58 of the NMOS transistor 60 and another layer of patterned photoresist can be used to mask the P-well 22 during implantation of the source and drain extensions of the PMOS transistor 62.

Figure 8:
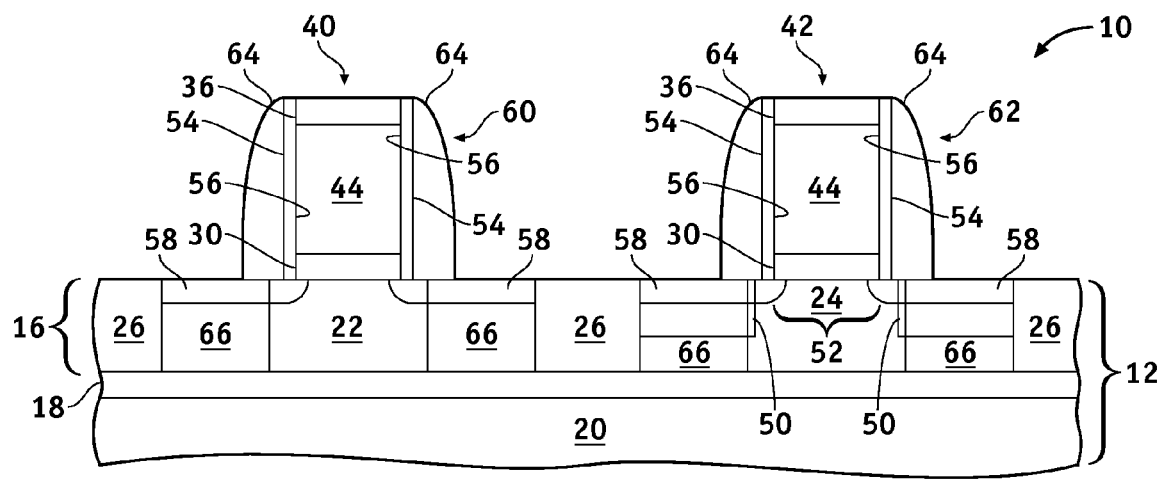

As illustrated in FIG. 8, sidewall spacers 64 are formed on the thin oxide layer 54 on the opposing sidewalls 56 of gate electrodes 44 of gate stacks 40 and 42. The sidewall spacers can be formed of silicon nitride, silicon oxide, or the like by depositing a layer of the spacer material over the gate electrodes and subsequently anisotropically etching the layer, for example, by RIE using a $CHF_3$, $CF_4$, or $SF_6$ chemistry. In accordance with one embodiment of the invention, sidewall spacers 64, gate electrodes 44, and STI 26 are used as an implantation mask to implant impurity ions into thin silicon layer 16 to form self-aligned source and drain regions 66 and into the polycrystalline silicon gate electrodes 44. P-type conductivity-determining ions are implanted into the thin silicon layer 16 to form source and drain regions 66 of PMOS transistor 62. Similarly, N-type conductivity-determining ions are implanted into thin silicon layer 16 to form source and drain regions 66 of NMOS transistor 60. Appropriate masking, for example with layers of patterned photoresist, can be used in the conventional manner to mask NMOS transistor 60 during the implanting of the PMOS source and drain regions and to mask PMOS transistor 62 during the implanting of the NMOS source and drain regions. In one embodiment, the ion implantations are activated by a thermal anneal such as a rapid thermal anneal (RTA).

Figure 9:
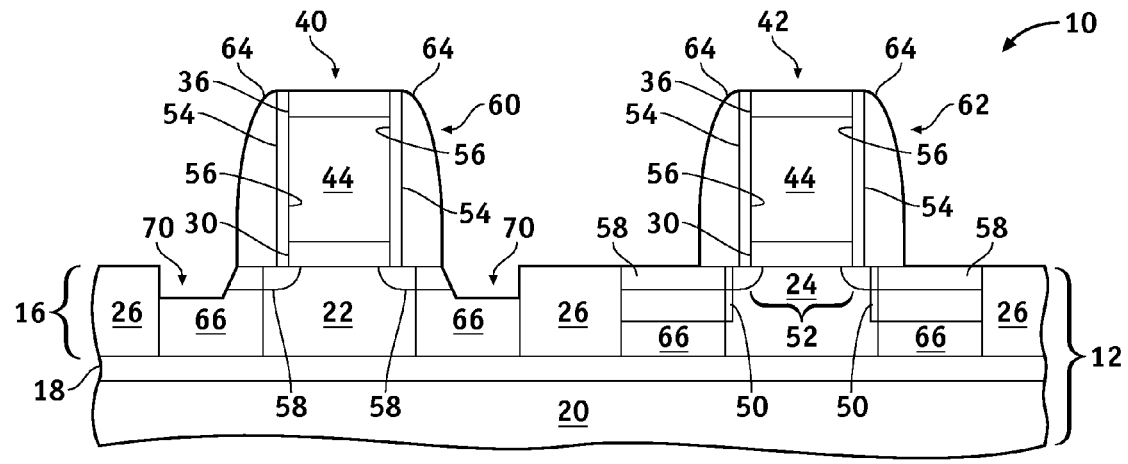

Either before or after the thermal anneal, sidewall spacers 64, gate stacks 40 and 42, and STI 26 then are used as an etch mask to etch recesses 70 in the P-well region 22, as illustrated in FIG. 9, using tetramethylammonium hydroxide (TMAH). In one exemplary embodiment, an aqueous solution having a concentration in the range of about 2% to 25% by weight TMAH is used to etch recesses 70. TMAH is a selective etchant that etches N-type doped silicon and polycrystalline silicon at a significantly greater rate than P-type doped silicon and polycrystalline silicon. Accordingly, during etching of the recesses 70 in P-well region 22, not only are the P-type doped source and drain extensions 58 and regions 66 of PMOS transistor 62 not significantly etched, but the gate electrodes 44 of both the NMOS transistor and the PMOS transistor are not significantly etched because the P-type implant regions 36 of the gate stacks 40 and 42 protect the polycrystalline silicon gate electrodes 44 from the TMAH. In this regard, the formation of the recesses does not require a mask, which would require costly and time-consuming deposition, etching, and removal steps, to protect the polycrystalline silicon electrodes 44. In one exemplary embodiment, the P-well region 22 is exposed to the TMAH for a time sufficient for the recesses 70 to be formed to a depth of about 10-20 nm. In another exemplary embodiment, recesses 70 are etched to a depth such that a portion of source and drain regions 66 remains surrounding recesses 70. While FIGS. 8 and 9 illustrate source and drain regions 66 of NMOS transistor 60 being formed before recesses 70, it will be appreciated that, in accordance with an alternate embodiment of the invention, recesses 70 can be etched into thin silicon layer 16 after formation of source and drain extensions 58 and sidewall spacers 64, and before the implantation of N-type impurity ions into recessed thin silicon layer 16 to form source and drain regions 66.

Figure 10:
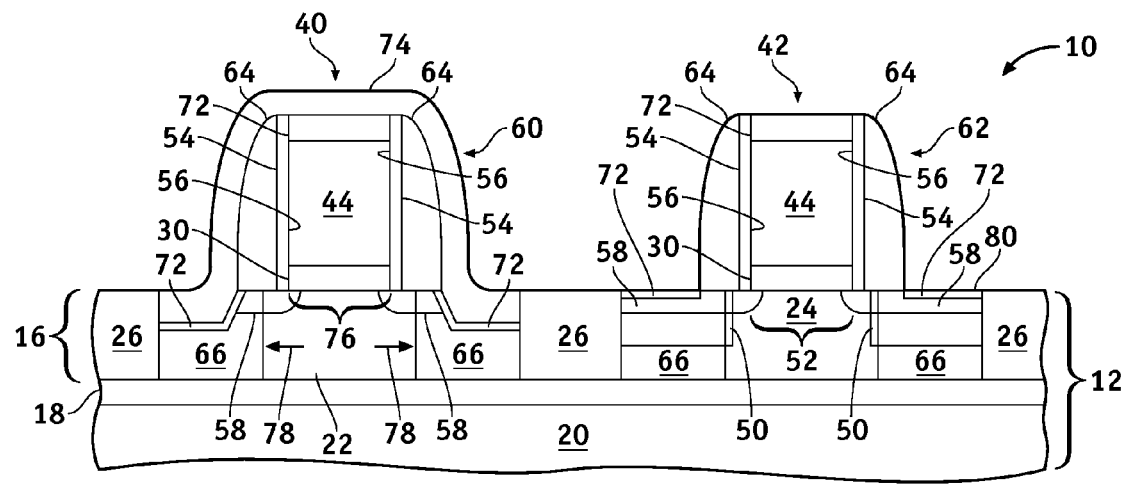

In accordance with one embodiment, after the formation of recesses 70, contact regions 72 are formed on the gate electrodes 44 of gate stacks 40 and 42 and on the exposed source and drain extensions 58 and regions 66 of the respective devices, as illustrated in FIG. 10. The contact regions 72 are preferably realized as a metal silicide layer. The contact regions 72 may be formed by depositing a blanket layer of silicide-forming metal onto the exposed surfaces of the source and drain extensions and regions of transistors 60 and 62 and the surface of the gate electrodes 44 and heated, for example by RTA, to react with exposed silicon and form a metal silicide layer 72 at the top of each of the source and drain extensions and regions as well as on gate electrodes 44. The silicide-forming metal can be, for example, cobalt, nickel, rhenium, ruthenium, or palladium, or alloys thereof and preferably is cobalt, nickel, or nickel plus about 5% platinum. The silicide-forming metal can be deposited, for example, by sputtering to a thickness of about 5-50 nm, preferably to a thickness of about 10 nm, and more preferably to a thickness that consumes the entire P-type implanted region 36 of gate electrodes 44. Any silicide-forming metal that is not in contact with exposed silicon, for example, the silicide-forming metal that is deposited on the spacers 64 or STI 26 does not react during the RTA to form a silicide and may subsequently be removed by wet etching in a $H_2O_2/H_2SO_4$ or $HNO_3/HCl$ solution.

After formation of the metal silicide layer 72, a tensile stress-inducing film 74 is formed within the recesses. The tensile stress-inducing film 74 can be any material that subjects a channel 76 underlying gate electrode 44 of gate stack 40 to tensile forces (represented by arrows 78). In one exemplary embodiment, the tensile stress-inducing film is formed to a thickness sufficient to fill recesses 70. For an NMOS transistor, a silicon nitride stress-inducing layer 72 can be deposited using a CVD, LPCVD, or PECVD process that results in a tensile stress-inducing film that subjects channel 76 to tensile forces. As is well known by those having skill in the art, stress in deposited silicon nitride films can be modified by adjusting the operating conditions of the vapor deposition process including temperature, pressure, and gas ratios to achieve a film having the desired tensile stress properties. By depositing the tensile stress-inducing layer 74 within the recesses 70 of NMOS transistor 60, a greater tensile stress is induced in channel 76 than if the recesses were not present and the tensile stress-inducing layer 74 merely overlied a surface 80 of thin silicon layer 16. Next, a hard mask (not shown) is deposited overlying the tensile stress-inducing layer and is patterned to expose that portion of the tensile stress-inducing layer overlying PMOS transistor 62. The tensile stress-inducing layer 74 then is removed from PMOS transistor 62, as illustrated in FIG. 10. A silicon nitride tensile stress-inducing layer 74 can be removed by, for example, RIE using a $CHF_3/O_2$ chemistry. The hard mask then is removed. In another exemplary embodiment, a tensile stress can be induced within channel 76 by growing silicon carbide (Si—C) within the recesses.

MOS device 10 can be completed by well known steps (not illustrated) such as depositing a layer of dielectric material, etching openings through the dielectric material and, with respect to NMOS transistor 60, through the stress-inducing layer 74, to expose portions of the metal silicide layer 72 overlying the source and drain extension/regions and the gate electrodes 44 of both transistors, and forming metallization that extends through the openings to electrically contact the metal silicide layer 72, as necessary. Further layers of interlayer dielectric material, additional layers of interconnect metallization, and the like may also be applied and patterned to achieve the proper circuit function of the integrated circuit being implemented.

Accordingly, methods for fabricating stressed MOS devices have been provided. The methods provide for the enhancement of the mobility of electrons in the channels of NMOS transistors. In this regard, the methods include the etching of recesses self-aligned to the gate electrodes of the NMOS transistors without simultaneous significant etching of the gate electrodes. A tensile stress-inducing material then can be deposited in the recesses to realize the enhanced mobility of the electrons. While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A method for fabricating a MOS device, the method comprising the steps of:
    providing a silicon substrate having a P-well region;
    depositing a polycrystalline silicon gate electrode layer overlying the P-well region of the silicon substrate;
    implanting P-type dopant ions into the polycrystalline silicon gate electrode layer to form a P-type implanted region;
    forming a first polycrystalline silicon gate electrode overlying the P-well region of the silicon substrate;
    etching recesses into the P-well region of the silicon substrate using the first polycrystalline silicon gate electrode as an etch mask, wherein the step of etching is performed by exposing the silicon substrate to tetramethylammonium hydroxide; and
    forming a tensile stress-inducing material within the recesses.

2. The method of claim 1, further comprising the step of implanting N-type dopant ions into the P-well region to form source and drain extensions self-aligned to the first polycrystalline silicon gate electrode, wherein the step of implanting N-type dopant ions is performed after the step of forming the first polycrystalline silicon gate electrode and before the step of etching recesses.

3. The method of claim 2, further comprising the step of forming sidewall spacers about sidewalls of the first polycrystalline silicon gate electrode, wherein the step of forming the sidewall spacers is performed after formation of the source and drain extensions and before the step of etching recesses.

4. The method of claim 3, further comprising the step of forming source and drain regions by implanting N-type dopant ions into the P-well region, wherein the step of forming the source and drain regions is performed before the step of etching recesses.

5. The method of claim 4, wherein the step of implanting P-type dopant ions comprises implanting P-type dopant ions to a concentration such that, after the step of forming the source and drain regions, the P-type implanted region is not counter-doped to the extent that it changes from P-type to N-type.

6. The method of claim 3, further comprising the step of forming source and drain regions by implanting N-type dopant ions into the P-well region, wherein the step of forming the source and drain regions is performed after the step of etching recesses.

7. The method of claim 6, wherein the step of implanting P-type dopant ions comprises implanting P-type dopant ions to a concentration such that, after the step of forming the source and drain regions, the P-type implanted region is not counter-doped to the extent that it changes from P-type to N-type.

8. The method of claim 1, wherein the step of implanting P-type dopant ions is performed using boron fluoride of a dosage in the range of about $10 \times 10^{15}$ to about $5 \times 10^{15}$ atoms/$cm^2$ and an energy of about 3 to about 5 keV.

9. The method of claim 1, wherein the step of implanting P-type dopant ions comprises implanting P-type dopant ions into the polycrystalline silicon gate electrode layer to form a P-type implanted region having a thickness of no greater than about 10 nm.

10. The method of claim 1, wherein:
    the step of providing a silicon substrate having a P-well region comprises providing a silicon substrate having the P-well region and an N-well region;
    the step of depositing a polycrystalline silicon gate electrode layer overlying the P-well region of the silicon substrate comprises depositing the polycrystalline silicon gate electrode layer overlying the P-well region and the N-well region; and the step of forming a first polycrystalline silicon gate electrode overlying the P-well region of the silicon substrate comprises forming a second polycrystalline silicon gate electrode overlying the N-well region of the silicon substrate.

11. The method of claim 1, wherein the step of forming a tensile stress-inducing material comprises forming a silicon nitride tensile stress-inducing layer.

12. A method for fabricating a CMOS device, the method comprising the steps of:
   depositing a polycrystalline silicon gate electrode layer overlying a silicon substrate having a P-well region and N-well region;
   implanting P-type dopant ions into the polycrystalline silicon gate electrode layer to form a P-type implanted region overlying the P-well region and the N-well region;
   etching the polycrystalline silicon gate electrode layer to form an NMOS gate electrode overlying the P-well region and a PMOS gate electrode overlying the N-well region;
   forming sidewall spacers about the NMOS gate electrode and the PMOS gate electrode;
   implanting N-type impurity dopants into the P-well region using the NMOS gate electrode and the sidewall spacers as an implantation mask to from source and drain regions of an NMOS transistor;
   implanting P-type impurity dopants into the N-well region using the PMOS gate electrode and the sidewall spacers as an implantation mask to from source and drain regions of a PMOS transistor;
   etching recesses into the P-well region using the NMOS gate electrode and the sidewall spacers as an etch mask, wherein the step of etching is performed by exposing the P-well region to tetramethylammonium hydroxide; and
   forming a tensile stress-inducing material in the recesses.

13. The method of claim 12, wherein the step of implanting N-type impurity dopants is performed after the step of etching recesses.

14. The method of claim 12, further comprising, after the step of etching the polycrystalline silicon gate electrode layer, the steps of:
   etching trenches into the N-well region, the trenches self-aligned to the PMOS gate electrode; and
   forming a compressive stress-inducing material within the trenches.

15. The method of claim 14, wherein the step of forming a compressive stress-inducing material comprises selectively epitaxially growing the compressive stress-inducing material within the trenches.

16. The method of claim 14, wherein the step of selectively epitaxially growing comprises selectively epitaxially growing silicon germanium within the trenches.

17. The method of claim 12, wherein the step of implanting P-type dopant ions is performed using boron fluoride of a dosage in the range of about $10 \times 10^{15}$ to about $5 \times 10^{15}$ atoms/cm$^2$ and an energy of about 3 to about 5 keV.

18. The method of claim 12, wherein the step of implanting P-type dopant ions comprises implanting P-type dopant ions into the polycrystalline silicon gate electrode layer to form a P-type implanted region having a thickness of no greater than about 10 nm.

19. The method of claim 12, wherein the step of implanting P-type dopant ions comprises implanting P-type dopant ions to a concentration such that, after the step of implanting N-type impurity dopants, the P-type implanted region is not counter-doped to the extent that it changes from P-type to N-type.

20. The method of claim 12, wherein the step of forming a tensile stress-inducing material comprises forming a silicon nitride tensile stress-inducing layer.

* * * * *